(12) United States Patent
North et al.

(10) Patent No.: US 12,375,070 B2
(45) Date of Patent: Jul. 29, 2025

(54) DYNAMIC CONTROL OF A MULTI-TRIM OSCILLATOR

(71) Applicant: TEXAS INSTRUMENTS INCORPORATED, Dallas, TX (US)

(72) Inventors: Gregory North, Austin, TX (US); Sudhakar Surendran, Bangalore (IN); Venkatraman Ramakrishnan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 18/390,818

(22) Filed: Dec. 20, 2023

(65) Prior Publication Data

US 2024/0313749 A1    Sep. 19, 2024

Related U.S. Application Data

(60) Provisional application No. 63/490,561, filed on Mar. 16, 2023.

(51) Int. Cl.
*H03K 21/00* (2006.01)
*H03K 3/037* (2006.01)
*H03K 5/00* (2006.01)
*H03K 5/133* (2014.01)
*H03K 21/10* (2006.01)

(52) U.S. Cl.
CPC ......... *H03K 5/00006* (2013.01); *H03K 3/037* (2013.01); *H03K 5/133* (2013.01); *H03K 21/10* (2013.01)

(58) Field of Classification Search
CPC . H03L 7/18; H03L 7/1803; H03L 7/16; H03L 7/1806; H03L 7/183; H03L 7/197; H03K 5/00006; H03K 21/00; H03K 21/10
See application file for complete search history.

(56) References Cited

U.S. PATENT DOCUMENTS

| | | | | |
|---|---|---|---|---|
| 9,825,587 B1* | 11/2017 | Kirschner | ................ | H03B 5/32 |
| 12,119,828 B1* | 10/2024 | Pfaff | .................. | H03K 5/00006 |
| 2009/0316847 A1* | 12/2009 | Thomsen | .............. | H03L 7/0991 |
| | | | | 375/373 |
| 2012/0293213 A1 | 11/2012 | Akaike et al. | | |
| 2012/0319738 A1* | 12/2012 | Nakamura | .............. | H03L 1/022 |
| | | | | 327/102 |

(Continued)

OTHER PUBLICATIONS

PCT Search Report for PCT/US2023/086374 dated May 1, 2024.

*Primary Examiner* — Tuan T Lam
(74) *Attorney, Agent, or Firm* — Brian D. Graham; Frank D. Cimino

(57) ABSTRACT

Embodiments disclosed herein relate to the management of a multi-trim oscillator to provide synchronization across multiple frequencies derived from the multi-trim oscillator without causing spurious pulses of clock output. In one example, a system provides a first clock signal via an oscillator and a second clock signal based on the first clock signal and a divider. The system further receives a first signal that indicates a change in a frequency of the first clock signal from a first frequency to a second frequency. In response to the first signal, the system determines an edge of the second clock signal and provides, at a time based on the edge of the second clock signal, a second signal to the oscillator to cause the change to the second frequency.

20 Claims, 6 Drawing Sheets

(56) References Cited

U.S. PATENT DOCUMENTS

| | | |
|---|---|---|
| 2013/0147526 A1* | 6/2013 | Kim .......................... G06F 1/08 |
| | | 327/114 |
| 2015/0015591 A1 | 1/2015 | Oh et al. |
| 2017/0063387 A1 | 3/2017 | Gao et al. |
| 2017/0117907 A1 | 4/2017 | Grollitsch |
| 2019/0050020 A1 | 2/2019 | Chu |
| 2023/0023440 A1* | 1/2023 | Casey .................... G16H 30/40 |
| 2024/0070770 A1* | 2/2024 | Marko ................ G07F 17/3288 |
| 2024/0201726 A1* | 6/2024 | Hsieh ........................ G06F 1/12 |

* cited by examiner

DYNAMIC CONTROL OF A MULTI-TRIM OSCILLATOR

RELATED APPLICATIONS

This application hereby claims the benefit of and priority to U.S. Provisional Patent Application No. 63/490,561, titled "DYNAMIC CONTROL OF MULTI-TRIM OSCILLATOR", filed Mar. 16, 2023, and which is hereby incorporated by reference in its entirety.

TECHNICAL FIELD

The technology disclosed herein relates generally to computer hardware and devices, and specifically, to multi-trim oscillators.

BACKGROUND

A multi-trim oscillator is an electronic circuit used in various applications, particularly in signal processing and communication systems. A multi-trim oscillator generates a stable and precise oscillating waveform with multiple trim points or adjustable parameters, allowing fine-tuning of the output signal's frequency, phase, or amplitude. The inclusion of multiple trim points provides flexibility in optimizing the oscillator's performance and ensures it operates with high accuracy and minimal drift over time. Such oscillators are commonly employed in radio frequency (RF) and microwave circuits, as well as in instrumentation and measurement equipment where precise signal generation is crucial.

The term "multi-trim" implies that the oscillator features more than one parameter that can be adjusted, such as frequency, amplitude, and phase. The trim points may be implemented as potentiometers or digital controls, enabling engineers and technicians to finely adjust the oscillator's output to meet specific system requirements or compensate for any environmental factors affecting the circuit's performance. The ability to make these adjustments make multi-trim oscillators versatile tools for achieving precise and stable signals in various electronic applications, ensuring the reliability and accuracy of the systems in which they are integrated.

In some systems, multiple oscillators are deployed to provide different frequencies to different electrical components within the system. For example, a first oscillator produces a first frequency that is provided to a processor, while a second oscillator produces a second frequency that is provided to a peripheral, such as a universal asynchronous receiver-transmitter (UART). However, when multiple oscillators are deployed in a system, difficulties arise in maintaining synchronization between the frequencies supplied by the oscillators. Additionally, excessive costs are incurred by the manufacturer of the system using multiple oscillators within a single system.

SUMMARY

Various embodiments disclosed herein relate to providing and managing a multi-trim oscillator to maintain synchronization across multiple frequencies of the same oscillator, without causing spurious pulses of clock output. In one embodiment, a system includes an oscillator configured to provide a first signal and a clock divider coupled to the oscillator and configured to provide a second clock signal based on the first clock signal. The system further includes oscillator control circuitry coupled to the oscillator and configured to receive a first signal that indicates a change in frequency of the first clock signal from a first frequency to a second frequency. In response to the first signal, the oscillator control circuitry is further configured to determine an edge of the second clock signal, and provide, at a time based on the edge of the second clock signal, a second signal to the oscillator to cause the change to the second frequency.

In one embodiment, a system includes an oscillator configured to provide a first clock signal and oscillator control circuitry coupled to the oscillator and configured to count clock edges associated with the first clock signal. The oscillator control circuitry is further configured to receive a first signal that indicates a change in frequency of the first clock signal from a first frequency to a second frequency. In response to the first signal, the oscillator control circuitry is configured to determine when the counted clock edges associated with the first clock signal satisfy a value and, when the counted clock edges associated with the first clock signal satisfy the value, identify an edge of a second clock signal, wherein the second clock signal comprises a divided version of the first clock signal. The oscillator control circuitry is also configured to provide, at a time based on the edge of the second clock signal, a second signal to the oscillator configured to cause the change to the second frequency.

This Summary is provided to introduce a selection of concepts in a simplified form that are further described below in the Detailed Description. It may be understood that this Summary is not intended to identify key features or essential features of the claimed subject matter, nor is it intended to be used to limit the scope of the claimed subject matter.

BRIEF DESCRIPTION OF THE DRAWINGS

The drawings are not necessarily drawn to scale. In the drawings, like reference numerals designate corresponding parts throughout the several views. In some embodiments, components or operations may be separated into different blocks or may be combined into a single block.

DETAILED DESCRIPTION

Figure 1:
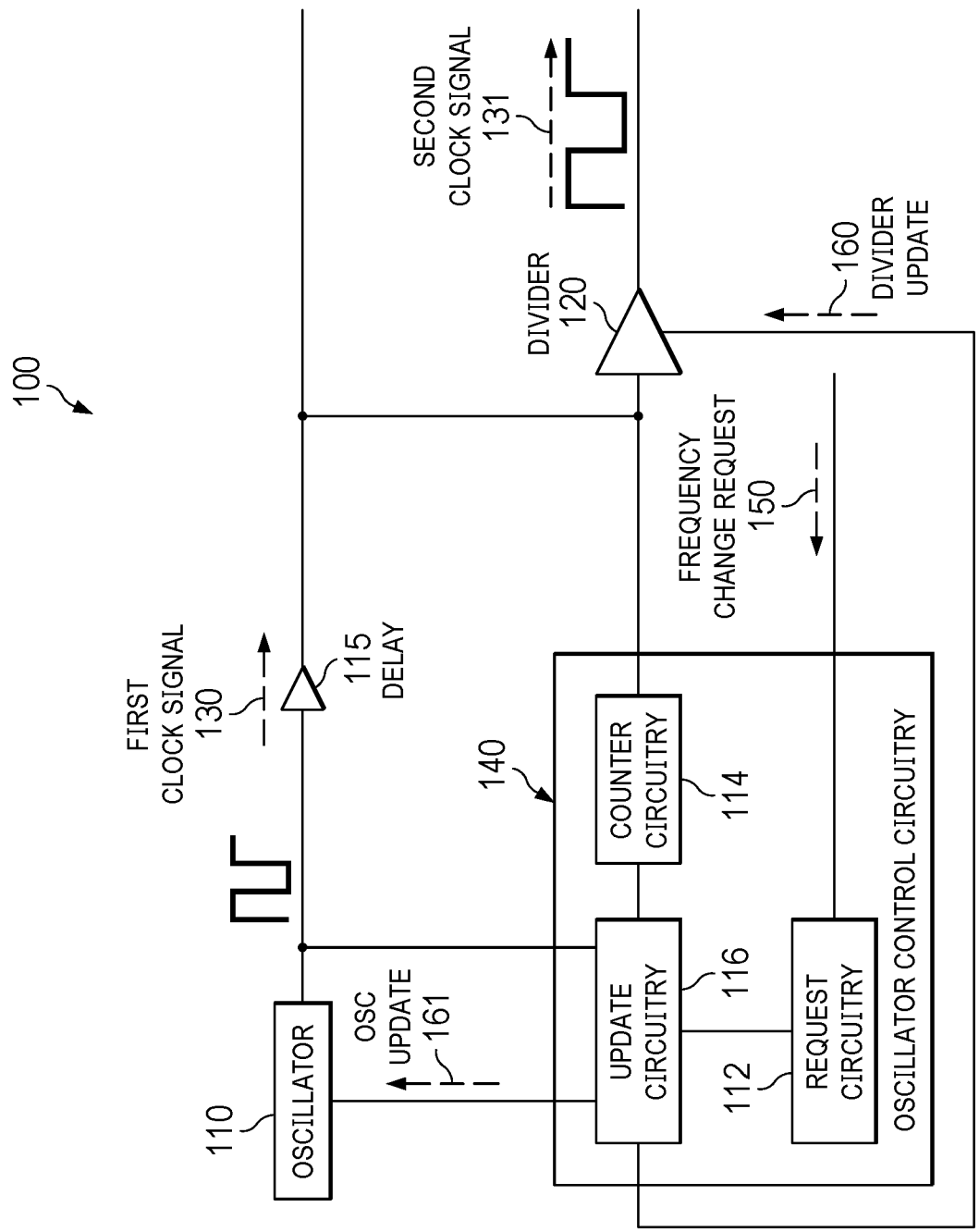
FIG. 1 illustrates a system to provide dynamic control of a multi-trim oscillator according to an implementation.

Embodiments of the present disclosure are directed at providing dynamic control of a multi-trim oscillator to maintain synchronization between different clock signals generated from the multi-trim oscillator. In a computing device, an oscillator is an electronic component or circuit that generates a continuous, repetitive signal in the form of an electrical waveform, such as a square wave or a sine wave. This signal serves as a timing reference or clock signal for various internal components and operations within the computing device. The oscillator's primary function is to maintain synchronization and timing precision in the device's digital circuits. It ensures that various parts of a computing system, such as the CPU, memory, and peripheral devices, operate in a coordinated and synchronized manner.

Here, to support peripherals and other components of a device that operate at different clock frequencies, the oscillator is coupled to a frequency divider circuit that can convert a first frequency provided from the oscillator to a second frequency required by the peripheral, such as a UART, an I2C device, or some other peripheral. A frequency divider circuit is an electronic circuit that takes an input signal with a certain frequency and generates an output signal with a lower frequency, which is a fraction or multiple of the input frequency. The primary purpose of a frequency divider is to reduce the frequency of a signal, making it more manageable for various applications. For example, a first frequency generated by the oscillator is provided to a processor on the system and a second frequency, representing a fraction of the first frequency, is provided to a communication peripheral.

In one embodiment of the present disclosure, the oscillator is coupled to oscillator control circuitry that provides a synchronous means to update the trim of the oscillator based on the frequency requirements of a second clock signal generated from a division of the clock signal from the oscillator. Specifically, while a first clock signal is at a first frequency, the divider generates a second clock signal that is a fraction of the original frequency. For example, the first frequency may represent 32 MHZ and the second frequency may represent 8 MHZ. While providing the 32 MHZ signal, a request is generated and received by the oscillator control circuitry indicating a request to change the frequency of the first clock signal from the oscillator (e.g., a request to reduce the frequency from 32 MHZ to 8 MHZ). In some examples, the request is generated by a processor indicating a request to place a device into a different power state supported by the different frequency. In response to the request, the oscillator control circuitry monitors for an edge associated with the second clock signal and provides a signal to the oscillator to cause a change in the frequency of the oscillator at a time based on the edge.

In some implementations, the oscillator control circuitry uses a counter to count the edges associated with the second clock signal. Returning to the example of a change from 32 MHZ to 8 MHZ for the first clock signal, the second clock signal represents a signal that one-fourth the frequency of the first clock signal. The oscillator control circuitry counts the number of edges associated with the first clock signal provided to the divider and determines when the next edge of the second clock signal will occur (i.e., on the fourth edge of the first clock signal). Based on when the edge of the second clock signal will occur, the oscillator control circuitry communicates a signal to the oscillator to update the frequency of the oscillator. Additionally, the oscillator control circuitry can provide a signal to the divider, indicating the update to the frequency and adjusting the division operations associated with the divider to reflect the change in frequency of the first clock signal (i.e., stop division or change the division parameters). Advantageously, the update may ensure a synchronous update of the second clock signal with the update to the first clock signal. Further, the second clock signal can remain at a constant frequency despite the change in frequency of the first clock signal without potential synchronicity issues caused with a change in the middle of the period of the second clock signal. The update prevents spurious pulses of the second clock signal.

FIG. 1 illustrates a system 100 to provide dynamic control of a multi-trim oscillator according to an implementation. System 100 includes oscillator 110, delay element 115, divider 120, and oscillator control circuitry 112. System 100 further includes first clock signal 130, second clock signal 131, frequency change request 150, divider update 160, and oscillator update 161. Oscillator control circuitry 140 further includes request circuitry 112, counter circuitry 114, and update circuitry 116.

In system 100, oscillator 110 is representative of a multi-trim oscillator that can provide first clock signal 130 at different frequencies. A multi-trim oscillator is a type of electronic oscillator that allows for precise adjustment of its output frequency by varying multiple control parameters, such as trim capacitors or inductors, which enable fine-tuning of the oscillation frequency. This flexibility in frequency adjustment is often used in applications requiring high-frequency stability and calibration, such as in communication systems and computing integrated circuits. First clock signal 130 is provided to processing systems and other communication peripherals, such as UARTs, I2C devices, or some other peripheral in system 100 via a clock tree that may include sets of buffers and conductive traces represented generally by delay element 115. Additionally, clock signal 130 as output by the delay element 115 is provided to divider 120 that generates second clock signal 131. Divider 120 takes first clock signal 130 as an input clock signal and produces second clock signal 131 as an output clock signal with a lower frequency by dividing the input frequency by an integer value. For example, clock signal 130 can comprise a 32 MHZ signal and the divider can divide the frequency by four to generate an 8 MHZ signal. Second clock signal 131 is provided via a separate clock tree to one or more peripherals, including UART devices, I2C devices, or some other peripheral requiring the frequency associated with second clock signal 131. In some examples, second clock signal 131 provides a constant frequency utilized by the peripherals, while first clock signal 130 provides a varying frequency based on an operating mode and/or other parameters of the connected components (e.g., processor).

While producing first clock signal 130 and second clock signal 131, oscillator control circuitry 140 monitors for frequency change requests associated with oscillator 110. Oscillator control circuitry encompasses a variety of components such as resistors, capacitors, inductors, transistors, registers, logic gates, integrated circuits, and wiring, as well as the arrangement and configuration of these elements. In at least one implementation, request circuitry 112 monitors for frequency change request 150 from another component or system, such as the main processing system for system 100. For example, frequency request 150 indicates a change from a first frequency to a second frequency when oscillator 110 supports two or more different frequencies. In response to frequency change request 150, update circuitry 116 determines an edge of second clock signal 131 using counter circuitry 114. Using the example of first clock signal 130 being 32 MHZ and second clock signal being 8 MHZ, counter circuitry 114 counts edges (or periods) associated with the first clock signal 130 following delay element 115 (i.e., delay result of clock tree buffering). Thus, counter circuitry 114 will monitor the count for a leading edge of four periods of first clock signal 130 to determine when the next leading edge will occur for second clock signal 131. When frequency change request 150 is indicated to update circuitry 116, update circuitry 116 uses the count information from counter circuitry 114 to change the frequency based on when the next leading edge will occur for second clock signal 131. The update is issued via oscillator update 161 that is provided as a signal to oscillator 110. Accordingly, the frequency of first clock signal 130 will be synchronized to correspond to the next leading edge of second clock signal 131.

Figure 2:
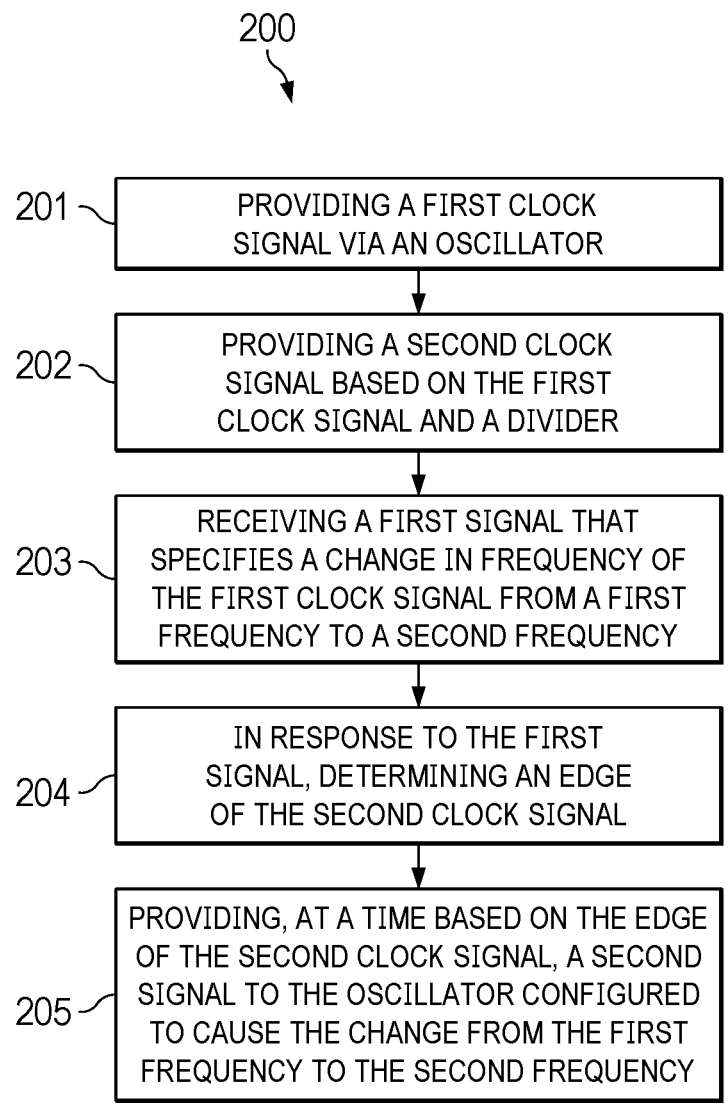
FIG. 2 illustrates a method of providing dynamic control of a multi-trim oscillator according to an implementation.

FIG. 2 illustrates a method 200 of providing dynamic control of a multi-trim oscillator according to an implementation. The steps of method 200 are referenced parenthetically in the paragraphs that follow with reference to elements of system 100 of FIG. 1.

Method 200 includes providing (201) a first clock signal 130 via an oscillator 110. The oscillator represents a multi-trim oscillator capable of providing a clock signal having a frequency selected from a set of multiple frequencies as requested by system 100. For example, oscillator 110 may be requested to provide a first frequency of 32 MHZ or a second frequency of 4 MHZ, although oscillator 110 can provide from more than two frequencies in some embodiments. In addition to providing first clock signal 130, method 200 further includes providing (202) a second clock signal 131 based on the first clock signal 130 and divider 120. Divider 120 receives input clock signal 130 and produces an output clock signal 131 with a lower frequency by dividing the input frequency by a positive integer value. Using the example of 32 MHZ for first clock signal 130, divider 120 can divide the frequency by an integer value to generate second clock signal 131 at another frequency (e.g., divide by eight to produce a 4 MHZ frequency). In some embodiments, divider 120 is used to produce a baud frequency for communication peripherals, such as UARTs and I2C devices. A baud frequency refers to the number of signal changes or symbols transmitted per second in digital communications, often representing bits or data elements.

While providing first clock signal 130 and second clock signal 131, method 200 further includes receiving (203) a first signal that specifies a change in frequency of the first clock signal 130 from a first frequency to a second frequency. In some implementations, the frequency change request 150 is generated by a processing system or other compute element on system 100 and is issued to support a desired power state. In some examples, frequency change request 150 will indicate a desired frequency from a set of available frequencies associated with oscillator 110. For example, an oscillator may have a first frequency that supports a first power state (e.g., faster frequency and higher power state) and a second frequency that supports a second power state (e.g., slower frequency and lower power state).

In response to the first signal, method 200 further includes determining (204) an edge of the second clock signal 131. As described previously, divider 120 divides the frequency of the first clock signal by an integer value to produce second clock signal 131. Using the integer value, counter circuitry 114 monitors the quantity of edges associated with first clock signal 130 to determine when the next clock signal will be triggered in association with second clock signal 131. For example, an edge of the second clock signal 131 may be generated for every eight edges of the first clock signal 130. In response to frequency change request 150, update circuitry 116 determines when the next edge will occur for second clock signal 131 based on the maintained count from counter circuitry 114. Specifically, counter circuitry 114 counts the number of edges associated with first clock signal 130 to determine when the eighth clock edge will occur, triggering the edge for second clock signal 131. Once the edge for the second clock signal is determined, method 200 further includes providing (205), at a time based on the edge of the second clock signal, a second signal to the oscillator configured to cause the change from the first frequency to the second frequency.

As an example, oscillator 110 initially provides a square wave first clock signal 130 with a frequency of 32 MHZ and divider 120 divides the frequency to provide a second clock signal 131 with a frequency of 4 MHZ. Frequency change request 150 is received by request circuitry 112 and indicates a request to reduce the frequency from oscillator 110 from 32 MHZ to 4 MHZ. In response to the request, update circuitry 116 monitors the count from counter circuitry 114 to determine when the next edge will occur in association with second clock signal 131 (i.e., the next edge of first clock signal 130 that will trigger the next edge of second clock signal 131). The edge for second clock signal 131 will occur once every eight edges and the eight edges are counted by counter circuitry 114. Once the next edge is identified for second clock signal 131, update circuitry 116 provides oscillator update 161 to oscillator 110 to trigger the update to 4 MHZ. The 4 MHZ frequency is triggered from oscillator 110 when the next positive edge of first clock signal 130 will trigger a positive edge in association with second clock signal 131.

In some implementations, in addition to updating oscillator 110, update circuitry 116 provides another signal as divider update 160 that indicates a change to first clock signal 130 and may specify a new divisor to generate the second clock signal 131. Using the example of the change from 32 MHZ to 4 MHZ, update circuitry 116 provides divider update 160 to indicate that the frequency of first clock signal 130 will match the desired frequency for second clock signal 131. Accordingly, rather than frequency dividing first clock signal 130, the frequency of the second clock signal 131 provided by the divider 120 will match first clock signal 130. In examples, where the frequency of the second clock signal 131 remains the same, the change in the frequency of the first clock signal 130 and the change in the divisor of the divider 120 may be synchronized using the counter circuitry 114 such that the time between edges of the second clock signal 131 remain the same before, during, and after the transition. This may avoid pulses in the second clock signal 131 that are longer or shorter than permitted.

In some embodiments, oscillator 110 supports more than two frequencies and oscillator control circuitry 140 provides similar operations to change oscillator 110 to any of the available frequencies. For example, frequency change request 150 will indicate a desired frequency for oscillator 110. In response to the indication, request circuitry 112 will prepare the update (i.e., notify update circuitry of the updated frequency), and update circuitry 116 will update oscillator 110 and divider 120 to reflect the desired frequency. Oscillator update 161 occurs at a time based on an identified edge for second clock signal 131 to maintain synchronization for second clock signal 131 with the edges from first clock signal 130.

Figure 3:
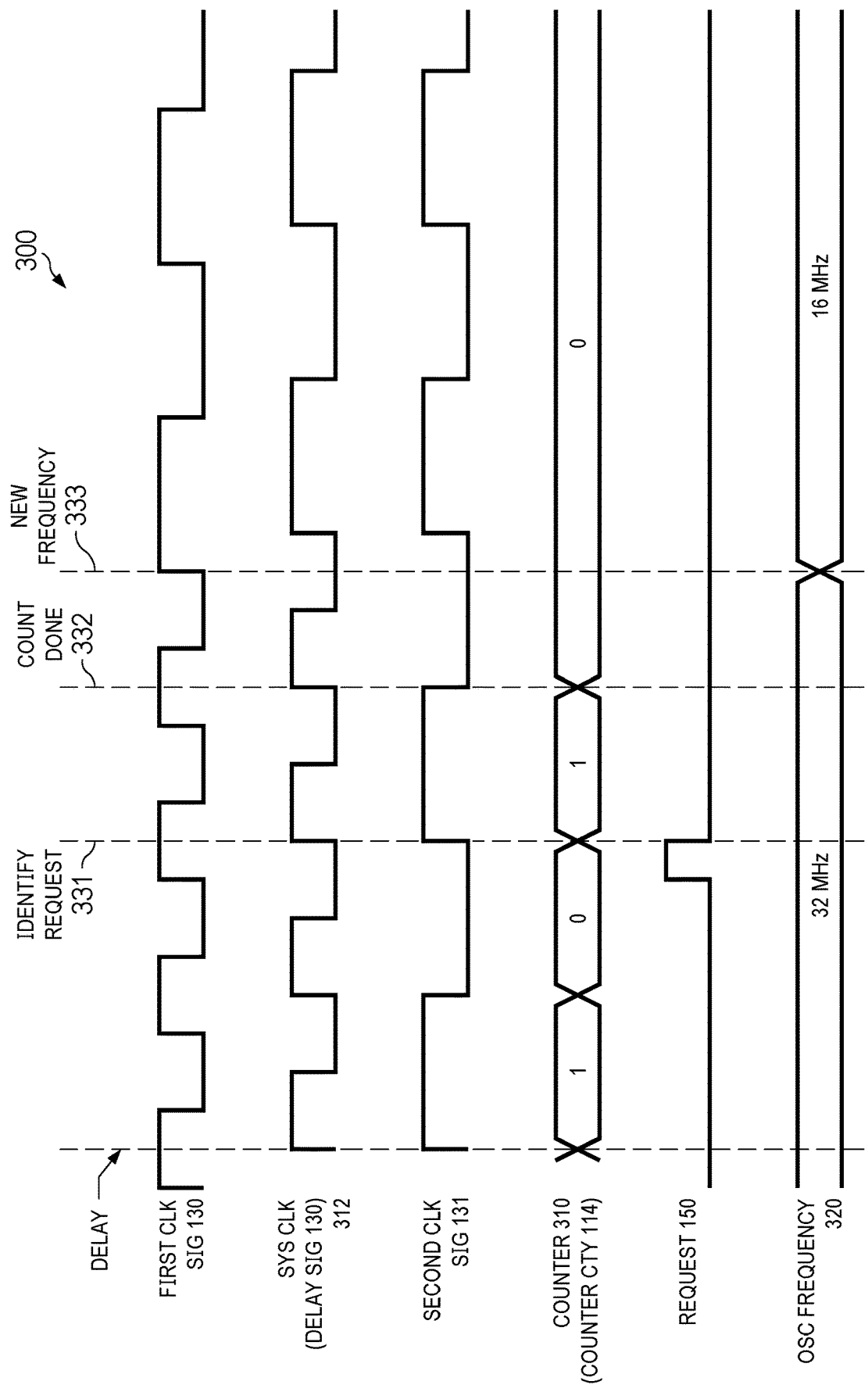
FIG. 3 illustrates a timing diagram of providing dynamic control of a multi-trim oscillator according to an implementation.

FIG. 3 illustrates a timing diagram 300 of providing dynamic control of a multi-trim oscillator according to an implementation. Timing diagram 300 includes a portion of the elements from system 100 of FIG. 1. FIG. 3 includes first clock signal 130, system clock 312 (representative of a delay from delay element 115 representing clock tree buffering of first clock signal 130), second clock signal 131, counter 310 from counter circuitry 114, frequency change request 150, and oscillator frequency 320 for first clock signal 130. Timing diagram 300 further includes identify request time 331, count done time 332, and new frequency time 333.

Timing diagram 300 demonstrates first clock signal 130 and system clock 312 at a first frequency and second clock signal 131 at a second frequency that is half the first frequency. Counter 310 demonstrates counting the number of edges associated with system clock 312. While monitoring the count associated with the number of edges for system clock 312, the oscillator control circuitry identifies request 150 to initiate the change of signal 130 from a first frequency to a second frequency. Request 150 can be provided by main processing circuitry in the computing system or can be provided by some other element in the system. In at least one implementation, request 150 indicates the desired new frequency, wherein the oscillator supports multiple different frequencies that are integer multiples of second clock signal 131.

Once the request is generated, the oscillator control circuitry identifies the request at time 331 and monitors counter 310 to determine when to initiate the change to the new frequency. Here, the request is identified when the count is at one, and the oscillator control circuitry waits for the count to be done at time 332. After the count reaches zero based on the edge of system clock 312, the oscillator control circuitry initiates (via a signal) an update of the frequency for first clock signal 130 to the new frequency at time 333. Here, the new frequency is equivalent to second clock signal 131 that is maintained as a constant frequency and thus counter 310 remains at zero. As a result, system clock 312 and signal 131 match following the update to the oscillator frequency.

In some implementations, the oscillator control circuitry updates the divider providing second clock signal 131 from first clock signal 130. In the illustrated example, the update indicates that frequency division of the first clock signal is no longer required. Specifically, because the frequency of first clock signal 130 matches the frequency of second clock signal 131 following the update to the oscillator, the first clock signal does not require division to be provided as the second clock signal. Advantageously, the second clock signal maintains the same frequency, while the first clock signal changes frequency to support power and frequency requests from other processing systems and peripherals. Additionally, the second clock signal can avoid spurious pulses that are undesirable for downstream peripherals.

Although demonstrated as decreasing the frequency of the oscillator in the examples of FIGS. 1-3, similar operations are performed to increase the frequency of the oscillator. Specifically, the oscillator control circuitry identifies a request to increase the frequency of the oscillator, identifies an edge for the second clock signal, and initiates an update of the frequency of the oscillator at a time based on the edge of the second clock signal. In some implementations, the second clock signal edge is identified based on counting edges associated with the first clock signal. For example, when a count reaches zero (i.e., the next edge of the first clock signal will cause the edge of the second clock signal), an update is provided to the oscillator to trigger the change in frequency to maintain synchronization in the second clock signal. The oscillator control circuitry in some examples also updates the divider for the second clock signal to indicate the change in the first clock signal.

Figure 4:
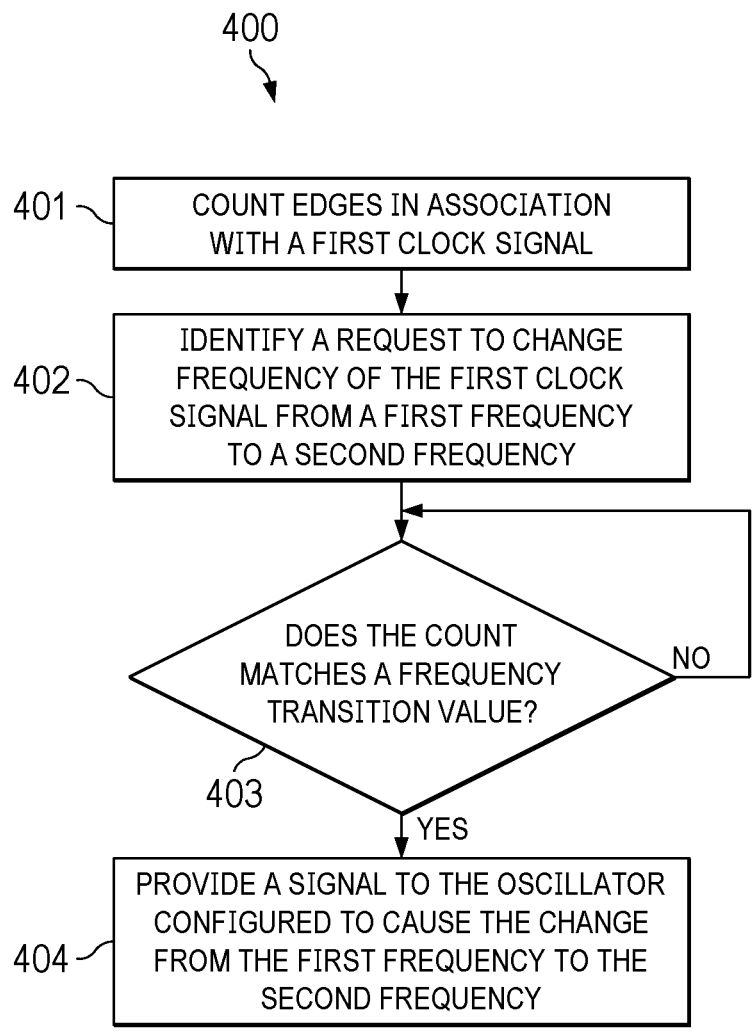
FIG. 4 illustrates an operation of oscillator control circuitry to manage a multi-trim oscillator according to an implementation.

FIG. 4 illustrates an operation 400 of oscillator control circuitry to manage a multi-trim oscillator according to an implementation. The steps of operation 400 are referenced parenthetically in the paragraphs that follow. Operation 400 is performed by oscillator control circuitry, such as oscillator control circuitry 140 of FIG. 1.

In operation 400, oscillator control circuitry counts (401) edges in association with a first clock signal. In some implementations, the first clock signal is provided as an input to a divider that generates a second clock signal by dividing the first clock signal by an integer value. For example, a first clock signal may be provided at 32 MHZ while a second clock signal may be provided at 4 MHZ. Consequently, the divider divides the first clock signal by eight to provide the second clock signal. Meanwhile, a counter in the oscillator control circuitry counts the edges of the first clock signal to determine when a new edge will occur in association with the second clock signal (e.g., every eight edges of the first clock signal will generate an edge for the second clock signal).

In addition to counting the edges, the oscillator control circuitry identifies (402) a request to change the frequency of the first clock signal from a first frequency to a second frequency. In response to the request, the oscillator control circuitry determines (403) whether the count satisfies a frequency transition value. In some embodiments, the counter performs a countdown to determine when the next edge will occur in association with the second clock signal. Returning to the example of the second clock signal at 4 MHZ with the first clock signal at 32 MHZ, the counter counts edges from the first clock signal from seven to zero cyclically. Once the counter transitions from one to zero, the oscillator control circuitry determines that the second clock signal satisfies a frequency condition value and provides (404) a signal to the oscillator configured to cause the change from the first frequency to the second frequency for the oscillator. When the count does not satisfy the frequency transition value, the oscillator control circuitry continues to monitor the count to determine when the value is satisfied. The value indicates that the next positive edge of the first clock signal will trigger the next positive edge of the second clock signal.

As an example, a processor generates a frequency change request that is identified by the oscillator control circuitry when the count is at four. The oscillator control circuitry monitors the edges and the count associated with edges of the first clock signal to determine when the count reaches zero (e.g., counting down from four based on edges of the first clock signal), indicating that the next edge from the first clock signal will correspond to the next edge of the second clock signal. Once identified, the oscillator control circuitry updates the oscillator to output the desired frequency. Additionally, in some embodiments, the oscillator control circuitry updates the divider to indicate the change in the frequency associated with the clock signal.

Figure 5:
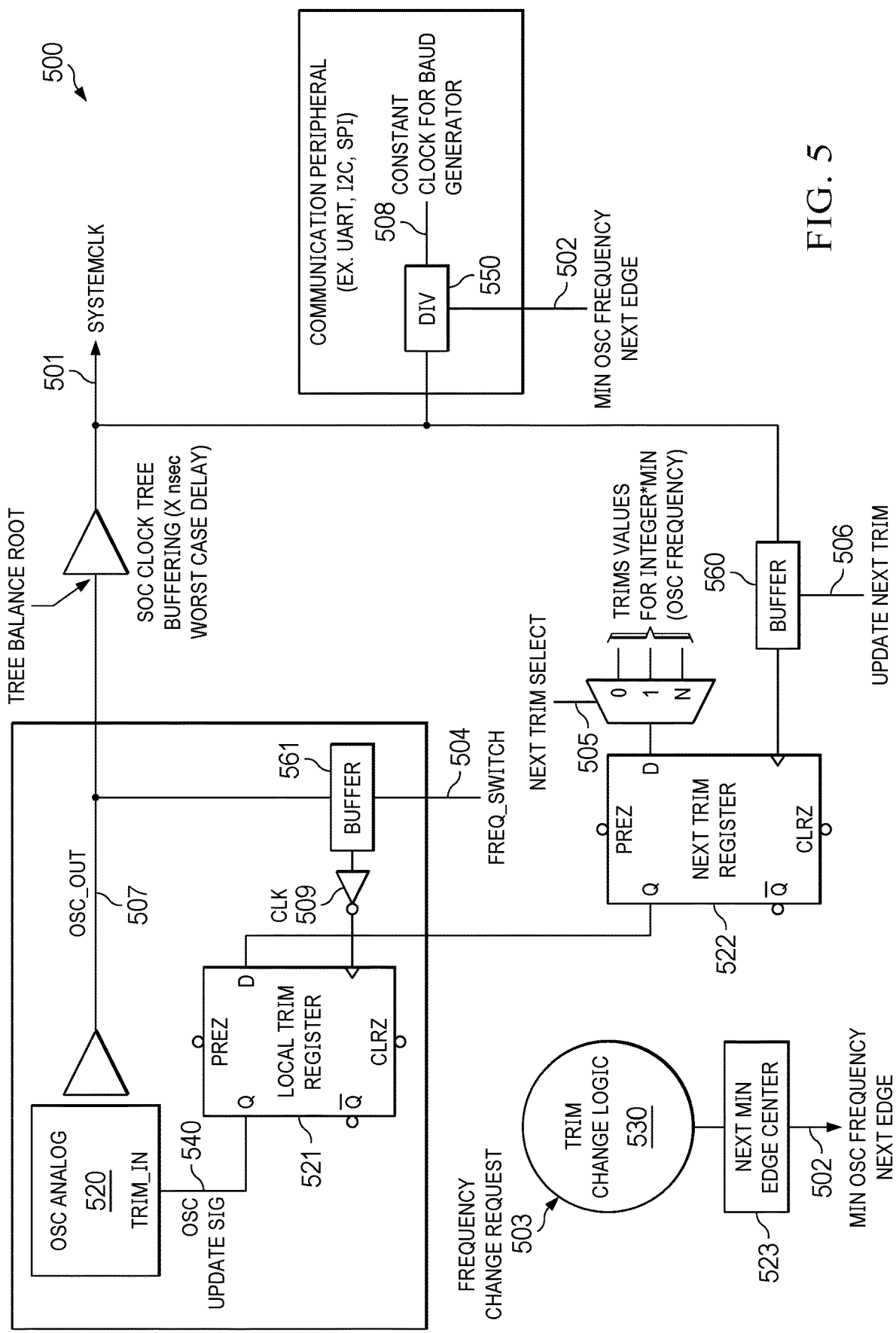
FIG. 5 illustrates a system to provide dynamic control of a multi-trim oscillator according to an implementation.

FIG. 5 illustrates a system 500 to provide dynamic control of a multi-trim oscillator according to an implementation. System 500 is representative of a system that is employed in a computer, controller system, or some other computing system. System 500 includes oscillator 520, which may be an implementation of oscillator 110, oscillator output (OSC_OUT) 507, which may be an implementation of first clock signal 130, system clock 501, which may be an implementation of system clock 312 derived from first clock signal 130, divider 550, which may be an implementation of divider 120, and constant clock 508, which may be an implementation of second clock signal 131. System 500 further includes frequency change request 503, which may be an implementation of frequency change request 150, OSC update signal 540, which may be an implementation of oscillator update 161, and minimum oscillator frequency next edge 502, which may be an implementation of divider update 160. System 500 also includes local trim register 521, next trim register 522, next minimum edge counter 523, trim change logic 530, update next trim 506, buffer 560, next trim select 505, frequency switch 504, and clock 509, which is a form of feedback signal from oscillator output 507 when frequency switch 504 is active to buffer 561. Local trim register 521, next trim register 522, next minimum edge counter 523, trim change logic 530, update next trim 506, buffer 560, next trim select 505, frequency switch 504, and clock 509 may all be representative of circuitry and signals of oscillator control circuitry 140 to implement the frequency update operations described herein. Trim change logic 530 is implemented as a finite state machine in some examples but may also be implemented using any combination of circuitry elements.

Trim registers 521-522 are used to adjust or trim the frequency output of oscillator 520. Such oscillators are commonly used in various electronic devices and applications, including clocks, timers, communication systems, and more. The trim registers allow for fine-tuning the oscillator's output frequency, ensuring that it meets the desired specifications. Here, the trim registers are used to change the frequency of oscillator 520 to support different power states in association with the system. Specifically, the trim registers are used to update oscillator 520 to provide different frequencies based on frequency requests from a main processor, communication module, or other component. For example, the trim registers can support an oscillator that provides a first frequency at 32 MHZ and a second frequency at 4 MHZ.

In addition to the frequencies supported by oscillator 520, the system further includes a divider 550 that is used to support a second clock signal (constant clock 508) based on the first clock signal. The divider divides the first clock signal by an integer value to generate the second clock signal. The second clock signal is provided to peripherals, such as UARTs, I2C devices, or some other devices for the system. In some implementations, while the first clock signal changes frequency, the second clock signal requires a constant frequency, such as a baud clock for communication peripherals. The trim change logic 530 with next minimum edge counter 523 determines when to update signals associated with trim registers 521-522 to implement the desired frequency from oscillator 520.

Figure 6:
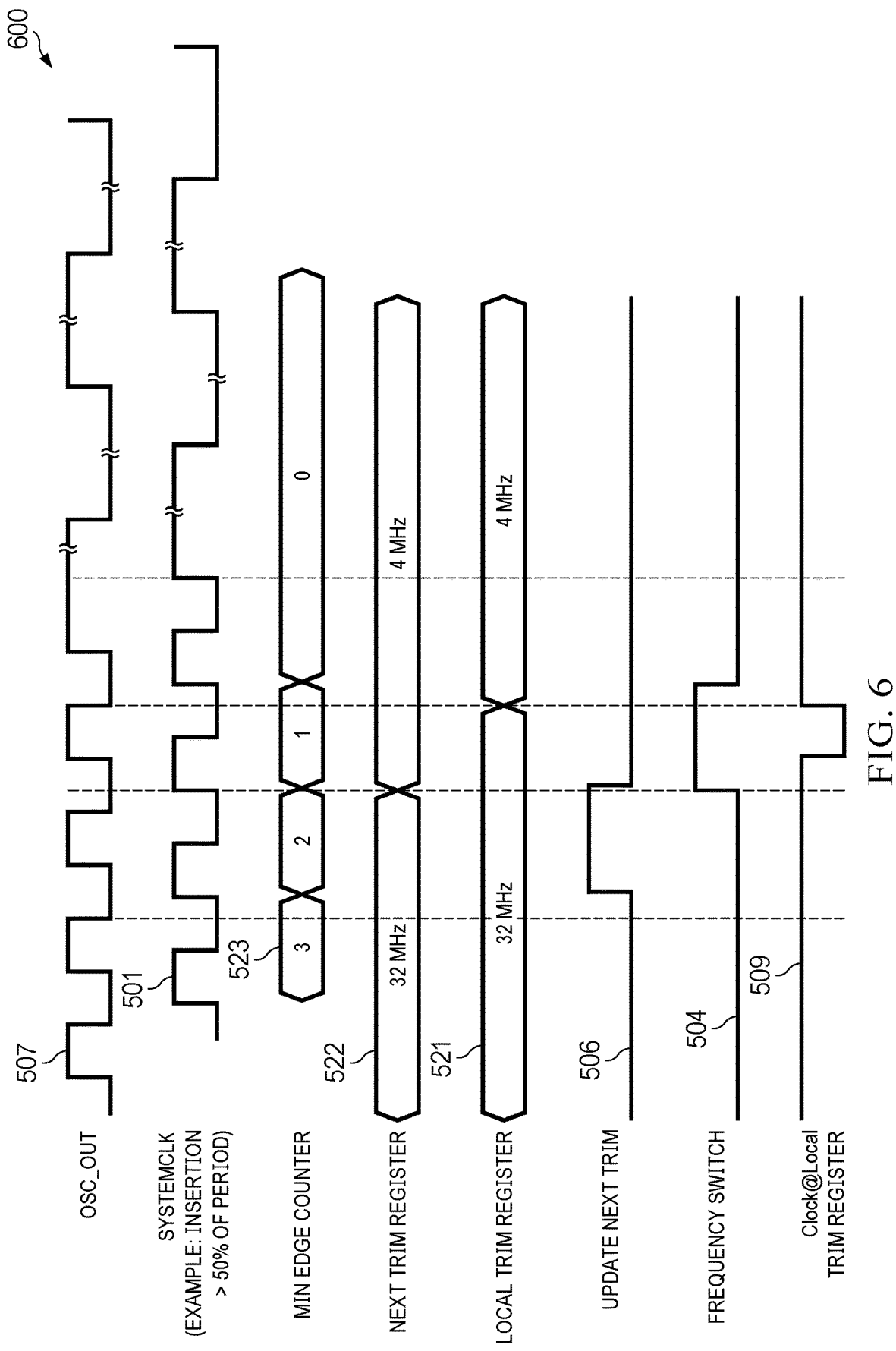
FIG. 6 illustrates a timing diagram of providing dynamic control of a multi-trim oscillator according to an implementation.

FIG. 6 illustrates a timing diagram 600 of providing dynamic control of a multi-trim oscillator according to an implementation. Timing diagram 600 represents the operation of system 500 of FIG. 5 to change the frequency of oscillator 520 from a first frequency to a second frequency. Timing diagram 600 includes oscillator output 507, system clock 501, minimum edge counter 523, next trim register 522, local trim register 521, update next trim register 521, update next trim 506, frequency switch 504, and clock 509 at local trim register 521. The paragraphs that follow will also reference trim change logic 530 and next minimum edge counter 523 (not pictured in FIG. 6) that generate signals to update the trim registers 521-522 using buffers 560-561 and oscillator out 507.

In timing diagram 600, trim change logic 530 receives frequency change request 503. In response to the request, trim change logic 530 works with the next minimum edge counter 523 to determine when to change the frequency of the oscillator. Here, oscillator out 507 is transitioned from a first frequency of 32 MHZ to 4 MHZ based on the frequency change request. System clock 501 is representative of a delayed oscillator out 507 due to clock tree buffering or other delays in system 500. The minimum edge counter (i.e., minimum edge counter 523 of FIG. 5) counts the positive edges associated with system clock 501 to identify the positive edges associated with the constant clock 508.

Here, following frequency change request (frequency change request 503 from system 500), trim change logic 530 transitions update next trim 506 from a low state to a high state at the positive edge of system clock 501 (when minimum edge counter 523 equals two) and returns to the low state following the next positive edge of system clock 501. Update next trim 506 is used to select the new frequency for oscillator 520. Specifically, if multiple frequencies are available (e.g., 32 MHZ, 20 MHZ, and 4 MHZ), next trim select 505 is used by a multiplexer to provide the frequency value to a data input of the next trim register 522 and update next trim 506 provides (using buffer 560 that holds the update until the next edge of the clock) a signal based on system clock 501 to a clock input of next trim register 522 to clock the frequency value (when minimum edge counter 523 equals one). In the example of timing diagram 600, next trim register 522 transitions from a 32 MHZ control signal to a 4 MHZ control signal at positive edge of system clock 501 when update next trim 506 is in a high state.

Additionally, trim change logic 530 transitions frequency switch 504 from a low state to a high state at the positive edge of system clock 501 when the minimum edge counter 523 is at a value of one. Frequency switch 504 is directed into buffer 561 which is used to hold the update until the next edge of system clock 501. Frequency switch 504 permits oscillator output 507 to be input as clock 509 to local trim register 521 from buffer 561. Specifically, clock 509 is the inverse of oscillator out 507. Once clock 509 transitions to a high state at the down edge of oscillator out 507, local trim register 521 transitions from a 32 MHZ control signal to a 4 MHZ control signal. Frequency switch 504 drops from a high state to a low state when minimum edge counter 523 transitions from one to zero.

After local trim register 521 is updated to the new frequency, oscillator 520 produces the 4 MHZ signal as oscillator output 507. Advantageously, the frequency of the oscillator is changed only when synchronization is maintained between system clock 501 and constant clock 508. The synchronization ensures that the constant clock is maintained during the change in frequency. Additionally, trim change logic 530 will update the minimum oscillator frequency next edge 502 (i.e., divider 550) to reflect the change in the oscillator frequency. Thus, when oscillator output 507 is moved from 32 MHZ to 4 MHZ and constant clock 508 is 4 MHZ, trim change logic 530 updates minimum oscillator frequency next edge 502 such that no division of system clock 501 occurs and maintains the 4 MHZ for constant clock 508.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any portions of this application. Where the context permits, words in the above Detailed Description using the singular or plural number may also include the plural or singular number respectively. The word "or" in reference to a list of two or more items, covers all the following interpretations of the word: any of the items in the list, all the items in the list, and any combination of the items in the list.

The phrases "in some embodiments," "according to some embodiments," "in the embodiments shown," "in other embodiments," and the like generally mean the feature, structure, or characteristic following the phrase is included in at least one implementation of the present technology and may be included in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in an order, alternative implementations may perform routines having steps, or employ systems having blocks, in a different order, and some processes or blocks may be deleted, moved, added, subdivided, combined, and/or modified to provide alternative or sub combinations. Each of the processes or blocks may be implemented in a variety of different ways. Also, while processes or blocks are at times shown as being performed in series, the processes or blocks may instead be performed or implemented in parallel or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology considering the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for" but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A system comprising:
   an oscillator configured to provide a first clock signal;
   clock divider circuitry coupled to the oscillator and configured to provide a second clock signal based on the first clock signal;
   oscillator control circuitry coupled to the oscillator and configured to:
      receive a first signal that indicates a change in frequency of the first clock signal from a first frequency to a second frequency;
      in response to the first signal, determine an edge of the second clock signal; and
      provide, at a time based on the edge of the second clock signal, a second signal to the oscillator configured to cause the change from the first frequency to the second frequency.

2. The system of claim 1 further comprising:
   a communication interface coupled to the clock divider circuitry and configured to receive the second clock signal.

3. The system of claim 1, wherein the second clock signal comprises a third frequency, and wherein the first frequency comprises an integer multiple of the third frequency.

4. The system of claim 3, wherein determining the edge of the second clock signal comprises:
   counting clock edges associated with the first clock signal;
   determining when the counted clock edges associated with the first clock signal satisfy a value; and
   when the counted clock edges associated with the first clock signal satisfy a value, identifying the edge for the second clock signal.

5. The system of claim 3, wherein the second frequency comprises an integer multiple of the third frequency.

6. The system of claim 3, wherein the oscillator control circuitry is further configured to:
   provide, at a second time based on the edge of the second clock signal, a third signal to the clock divider circuitry configured to cause the clock divider circuitry to maintain the third frequency.

7. The system of claim 1, wherein the second clock signal comprises a baud clock signal.

8. The system of claim 1, wherein receiving the first signal that indicates the change in frequency of the first clock signal from the first frequency to the second frequency comprises receiving, from a processor, the first signal.

9. The system of claim 1, wherein the oscillator control circuitry is further configured to:
   receive a third signal that indicates a second change in the frequency of the first clock signal from the second frequency to a third frequency;
   in response to the third signal, determine a second edge of the second clock signal; and
   provide, at a second time based on the second edge of the second clock signal, a fourth signal to the oscillator configured to cause the change to the third frequency.

10. The system of claim 1, wherein the second clock signal comprises a third frequency, wherein the second frequency comprises a multiple of the third frequency.

11. A system comprising:
    an oscillator configured to provide a first clock signal; and oscillator control circuitry coupled to the oscillator and configured to:
    count clock edges associated with the first clock signal;
    receive a first signal that indicates a change in frequency of the first clock signal from a first frequency to a second frequency;
    in response to the first signal:
        determine when the counted clock edges associated with the first clock signal satisfy a value;
        when the counted clock edges associated with the first clock signal satisfy the value, identify an edge of a second clock signal, wherein the second clock signal comprises a divided version of the first clock signal; and
        provide, at a time based on the edge of the second clock signal, a second signal to the oscillator configured to cause the change to the second frequency.

12. The system of claim 11 further comprising:
clock divider circuitry coupled to the oscillator and configured to provide the second clock signal from the first clock signal.

13. The system of claim 12 further comprising:
a communication interface coupled to the clock divider circuitry and configured to receive the second clock signal.

14. The system of claim 12, wherein the second clock signal comprises a third frequency, and wherein the first frequency and the second frequency are integer multiples of the third frequency.

15. The system of claim 14, wherein the oscillator control circuitry is further configured to:
    provide, at a second time based on the edge of the second clock signal, a third signal to the clock divider circuitry configured to cause the clock divider circuitry to maintain the third frequency.

16. The system of claim 11, wherein the second clock signal comprises a baud clock signal.

17. The system of claim 11, wherein receiving the first signal that indicates the change in frequency of the first clock signal from the first frequency to the second frequency comprises receiving, from a processor, the first signal.

18. A system comprising:
clock divider circuitry coupled to an oscillator and configured to:
    receive a first clock signal from the oscillator; and
    provide a second clock signal based on the first clock signal;
oscillator control circuitry coupled to the clock divider circuitry and configured to:
    receive a first signal that indicates a change in frequency for the first clock signal from a first frequency to a second frequency;
    in response to the first signal, determine an edge of the second clock signal; and
    provide, at a time based on the edge of the second clock signal, a second signal to the oscillator configured to cause the change to the second frequency.

19. The system of claim 18, wherein the second clock signal comprises a third frequency, wherein the first frequency comprises an integer multiple of the third frequency.

20. The system of claim 19, wherein the second frequency comprises an integer multiple of the third frequency.

* * * * *